US012685010B2

(12) United States Patent
Li et al.

(10) Patent No.: US 12,685,010 B2
(45) Date of Patent: Jul. 14, 2026

(54) QUANTUM DOTS SUBSTRATE AND PREPARATION METHOD THEREOF

(71) Applicant: Shenzhen China Star Optoelectronics Semiconductor Display Technology Co., Ltd., Shenzhen (CN)

(72) Inventors: Xuefei Li, Shenzhen (CN); Jinyang Zhao, Shenzhen (CN); Lixuan Chen, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 302 days.

(21) Appl. No.: 18/536,096

(22) Filed: Dec. 11, 2023

(65) Prior Publication Data

US 2024/0315126 A1 Sep. 19, 2024

(30) Foreign Application Priority Data

Mar. 13, 2023 (CN) .......................... 202310265299.2

(51) Int. Cl.
*H10K 85/30* (2023.01)
*C09K 11/02* (2006.01)
(Continued)

(52) U.S. Cl.
CPC .......... *H10K 85/381* (2023.02); *C09K 11/025* (2013.01); *H10K 50/115* (2023.02); *H10K 71/12* (2023.02); *H10K 85/30* (2023.02); *H10K 85/341* (2023.02); *H10K 85/40* (2023.02); *B82Y 20/00* (2013.01); *B82Y 40/00* (2013.01)

(58) Field of Classification Search
None
See application file for complete search history.

(56) References Cited

U.S. PATENT DOCUMENTS

2016/0144348 A1* 5/2016 Son ........................ B01J 23/745
136/254
2022/0367830 A1 11/2022 Jung

FOREIGN PATENT DOCUMENTS

CN 113161496 A 7/2021
CN 113745442 A 12/2021

OTHER PUBLICATIONS

Chinese Office Action issued in corresponding Chinese Patent Application No. 202310265299.2 dated Apr. 30, 2026, pp. 1-7.

* cited by examiner

*Primary Examiner* — Kyoung Lee
(74) *Attorney, Agent, or Firm* — PV IP PC; Wei Te Chung

(57) ABSTRACT

According to the preparation method of the quantum dots substrate, a first ligand modifies on an outer surface of each of the quantum dots, a second ligand modifies on an outer surface of each of nanoparticles. And one of the first ligand and the second ligand is provided as a compound containing a sulfhydryl group and the other as a compound containing a double bond, so that after the quantum dots and the nanoparticles are co-deposited on a first electrode or on a second electrode, the first ligands and the second ligands can be subjected to a thiolene group click reaction so as to be crosslinked under the initiation of photoinitiators, thereby enabling the quantum dots and the nanoparticles to be connected. An obtained pattern of the patterned quantum dots thin film is consistent with a pattern of the first electrode or of the second electrode.

17 Claims, 6 Drawing Sheets

(51) Int. Cl.
    *H10K 50/115*       (2023.01)
    *H10K 71/12*        (2023.01)
    *H10K 85/40*       (2023.01)
    *B82Y 20/00*       (2011.01)
    *B82Y 40/00*       (2011.01)

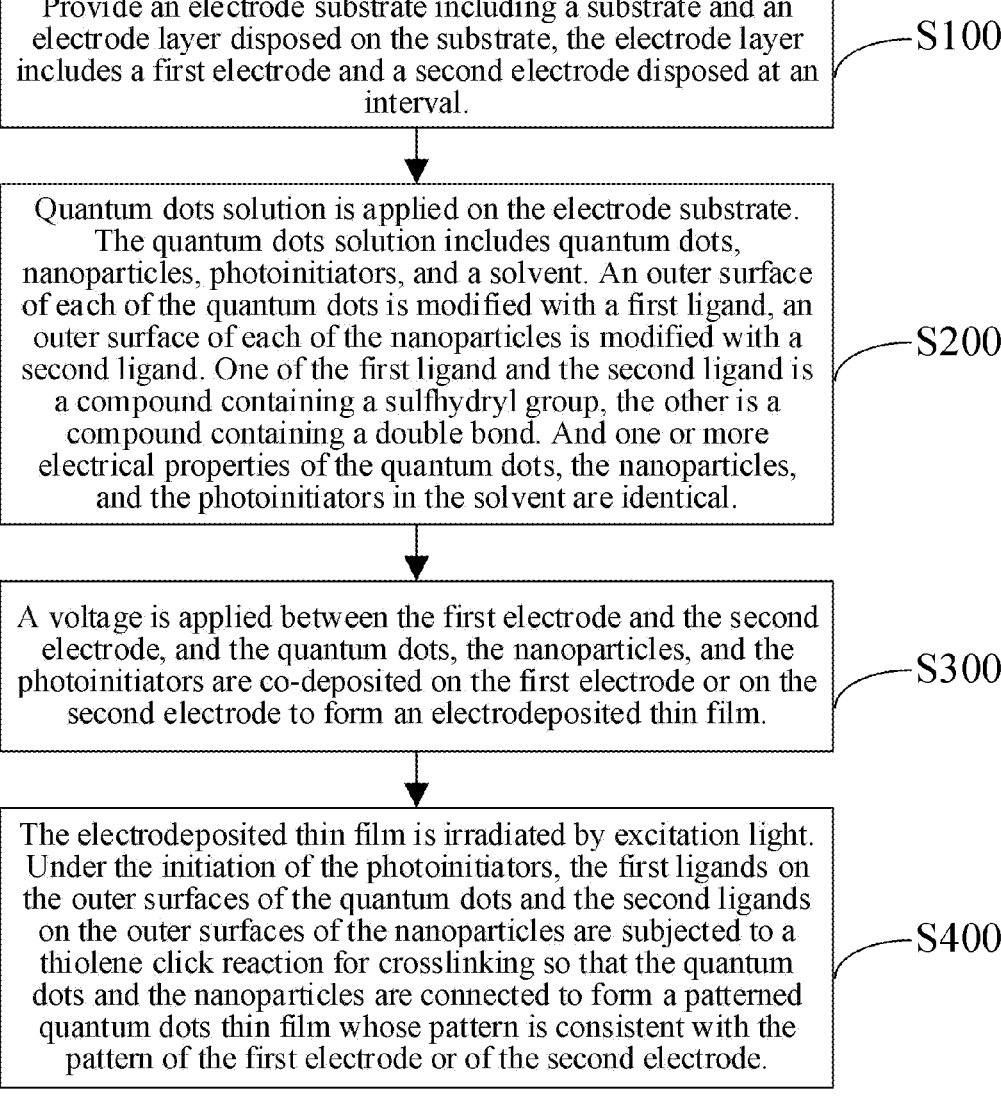

Provide an electrode substrate including a substrate and an electrode layer disposed on the substrate, the electrode layer includes a first electrode and a second electrode disposed at an interval. ⟶ S100

Quantum dots solution is applied on the electrode substrate. The quantum dots solution includes quantum dots, nanoparticles, photoinitiators, and a solvent. An outer surface of each of the quantum dots is modified with a first ligand, an outer surface of each of the nanoparticles is modified with a second ligand. One of the first ligand and the second ligand is a compound containing a sulfhydryl group, the other is a compound containing a double bond. And one or more electrical properties of the quantum dots, the nanoparticles, and the photoinitiators in the solvent are identical. ⟶ S200

A voltage is applied between the first electrode and the second electrode, and the quantum dots, the nanoparticles, and the photoinitiators are co-deposited on the first electrode or on the second electrode to form an electrodeposited thin film. ⟶ S300

The electrodeposited thin film is irradiated by excitation light. Under the initiation of the photoinitiators, the first ligands on the outer surfaces of the quantum dots and the second ligands on the outer surfaces of the nanoparticles are subjected to a thiolene click reaction for crosslinking so that the quantum dots and the nanoparticles are connected to form a patterned quantum dots thin film whose pattern is consistent with the pattern of the first electrode or of the second electrode. ⟶ S400

FIG. 1 excitation light

QUANTUM DOTS SUBSTRATE AND PREPARATION METHOD THEREOF

CROSS-REFERENCE TO RELATED APPLICATIONS

This application claims priority to Chinese Patent Application No. 202310265299.2 filed on Mar. 13, 2023. The disclosure of the aforementioned application is incorporated herein by reference in its entirety.

TECHNICAL FIELD

The present application relates to quantum dots, and more particularly, to quantum dots substrate and preparation method thereof.

BACKGROUND

Quantum dots (QDs) have the characteristics of small size, high brightness, narrow emission, and tunable color, and therefore have a very important application prospect in the fields of LEDs, display technologies, solar cells, optical switches, sensing, and detection.

The development of patterning of QDs is of great value for their applications in the fields of LEDs, display technologies, solar cells, optical switches, sensing and detection. The patterning of electrically driven colloidal quantum dots is a relatively advanced QDs patterning technique in which QDs with charged surface ligands aggregate, under influence of an electrode, on the surface of the electrode, and a patterned electrode will make the QDs to aggregate at specific positions according to a specific shape to form a patterned QD thin film. To improve the luminous efficiency of the QD thin film, nanoparticles having a scattering effect are generally introduced into a QD system. However, the patterned QD thin film formed by co-depositing the QDs with the nanoparticles has a low density and is easily dissolved by a solvent, thereby causing poor stability of the patterned QD thin film.

SUMMARY

One or more embodiments of the present application provides a quantum dots substrate and a preparation method thereof, which can improve a density of a patterned quantum dots thin film so that the patterned quantum dots thin film is difficult to be dissolved by a solvent, thereby improving a stability of the patterned quantum dots thin film.

According to a first aspect, one or more embodiments of the present invention provides a preparation method of a quantum dots substrate, including: providing an electrode substrate including a substrate and an electrode layer disposed on the substrate, where the electrode layer includes a first electrode and a second electrode disposed at an interval; applying quantum dots solution on the electrode substrate, where the quantum dots solution includes quantum dots, nanoparticles, photoinitiators, and solvent, an outer surface of each of the quantum dots is modified with a first ligand, an outer surface of each of the nanoparticles is modified with a second ligand, one of the first ligand and the second ligand is a compound containing a sulfhydryl group and the other is a compound containing a double bond, one or more electrical properties of the quantum dots, the nanoparticles, and the photoinitiators are identical; applying a voltage between the first electrode and the second electrode, such that the quantum dots, the nanoparticles, and the photoinitiators are co-deposited on the first electrode or on the second electrode to form an electrodeposited thin film; irradiating the electrodeposited thin film with excitation light, where under an initiation of the photoinitiators, the first ligand on the outer surface of each of the quantum dots and the second ligand on the outer surface of each of the nanoparticles are subjected to a thiolene click reaction to crosslink so that each of the quantum dots and each of the nanoparticles are connected to form a patterned quantum dots thin film whose pattern is consistent with a pattern of the first electrode or of the second electrode.

The preparation method of the quantum dots substrate further includes volatilizing the solvent in the quantum dots solution to form the dried patterned quantum dots thin film.

In one or more embodiments, the compound containing the double bond includes at least one of oleic acid, acrylic acid, oleylamine, and γ-methacryloxypropyltrimethoxysilane; the compound containing the sulfhydryl group includes at least one of dimercapto-terminated polyethylene glycol, 3-mercapto-β,4-dimethylcyclohexylethylthiol, 1,7-dodecyldithiol, 1,7-octyldithiol, 1,3-propanedithiol, (R)-6,8-dimercaptooctanoic acid, and 2,3-dithio(2-mercapto)-1-propanethiol; and the photoinitiators includes at least one of benzoin and a derivative thereof, a benzil compound, an alkylbenzophenone compound, an acyl phosphorus oxide, a benzophenone compound, and a thioxanthone compound.

In one or more embodiments, each of the quantum dots has a particle size of 10 nm~20 nm and each of the nanoparticles has a particle size of 10 nm~300 nm.

In one or more embodiments, in the quantum dots solution, a mass ratio of the quantum dots to the nanoparticles is (1~10):(10~1), and an amount of the photoinitiators added is 0.1%~5% of a total mass of the quantum dots and the nanoparticles.

In one or more embodiments, the first electrode includes a plurality of first electrode units sequentially arranged in a first direction and parallel to each other, and the second electrode includes a plurality of second electrode units sequentially arranged in the first direction and parallel to each other, and the first electrode units and the second electrode units are alternately arranged in the first direction at intervals.

In one or more embodiments, when a voltage is applied between the first electrode and the second electrode, an electric field strength between the adjacent first electrode unit and the second electrode unit is 0.1V/μm~10V/μm.

In one or more embodiments, irradiating the electrodeposited thin film with excitation light includes irradiating the electrodeposited thin film with ultraviolet light for 10 minutes to 60 minutes.

In one or more embodiments, each of the quantum dots comprise at least one of a core-shell structure quantum dot and a perovskite quantum dot, the core-shell structure quantum dot comprises a light-emitting core comprising at least one of $ZnCdSe_2$, InP, $Cd_2SSe$, CdSe, $Cd_2SeTe$ and InAs and an inorganic protective shell covering an outer surface of the light-emitting core, the inorganic protective shell comprises at least one of CdS, ZnSe, $ZnCdS_2$, ZnS, ZnO; materials of the nanoparticles comprise at least one of $SiO_2$, $BaSO_4$, $CaCO_3$, ZnSe, CdS, $TiO_2$, $BaTiO_3$, ZnS, $ZrO_2$, $Si_3N_4$, SnO, and ZnO; and the solvent comprises at least one of propylene glycol methyl ether acetate, ethanol, N,N-dimethylformamide, dimethyl sulfoxide, ethyl acetate, and water.

According to a second aspect, one or more embodiments of the present invention provides a quantum dots substrate including a substrate, an electrode layer, and a patterned quantum dots thin film that are sequentially stacked. The electrode layer includes a first electrode and a second electrode disposed at an interval, and a pattern of the patterned quantum dots thin film is consistent with a pattern of the first electrode or of the second electrode.

The patterned quantum dots thin film includes quantum dots and nanoparticles, the outer surface of each of the quantum dots is modified with a first ligand, the outer surface of each of the nanoparticles is modified with a second ligand, one of the first ligand and the second ligand is a compound containing a sulfhydryl group, the other is a compound containing a double bond, and the first ligand and the second ligand are crosslinked by a thiolene click reaction.

According to the preparation method of the quantum dots substrate provided in the embodiment of the present invention, the first ligand modifies on the outer surface of each of the quantum dots, the second ligand modifies on the outer surface of each of the nanoparticles. One of the first ligand and the second ligand is provided as a compound containing a sulfhydryl group, and the other is a compound containing a double bond, so that after the quantum dots and the nanoparticles are co-deposited on the first electrode or on the second electrode, the first ligands and the second ligands can be subjected to a thiolene click reaction so as to be cross-linked together under the initiation of the photoinitiators, so that the quantum dots and the nanoparticles are connected, and a resulted pattern of the patterned quantum dots thin film is consistent with a pattern of the first electrode or of the second electrode. And the patterned quantum dots thin film has a high density and is difficult to be dissolved by a solvent, thereby improving the stability of the patterned quantum dots thin film, and facilitating subsequent electrodeposition on the patterned quantum dots thin film to form quantum dots thin film of other color. Thus, a patterned multi-color quantum dots thin film is obtained.

BRIEF DESCRIPTION OF THE DRAWINGS

In order that the technical solution in the embodiments of the present application may be explained more clearly, a brief description of the drawings required for use in the description of the embodiments will be given below.

FIG. 1 is a flow chart of a preparation method of a quantum dots substrate according to one or more embodiments of the present application.

DETAILED DESCRIPTION

The technical solution in one or more embodiments of the present application will be clearly and completely described with reference to the accompanying drawings. It will be apparent that the described embodiments are only part of embodiments of the present application, and not all embodiments. Based on the embodiments in the present application, all other embodiments obtained by a person skilled in the art without involving any inventive effort fall within the scope of the present application.

Referring to FIG. 1 while referring to FIGS. 2-11, one or more embodiments of the present application provide a preparation method of a quantum dots substrate, including step 100, step 200, step 300 and step 400.

Figure 2:
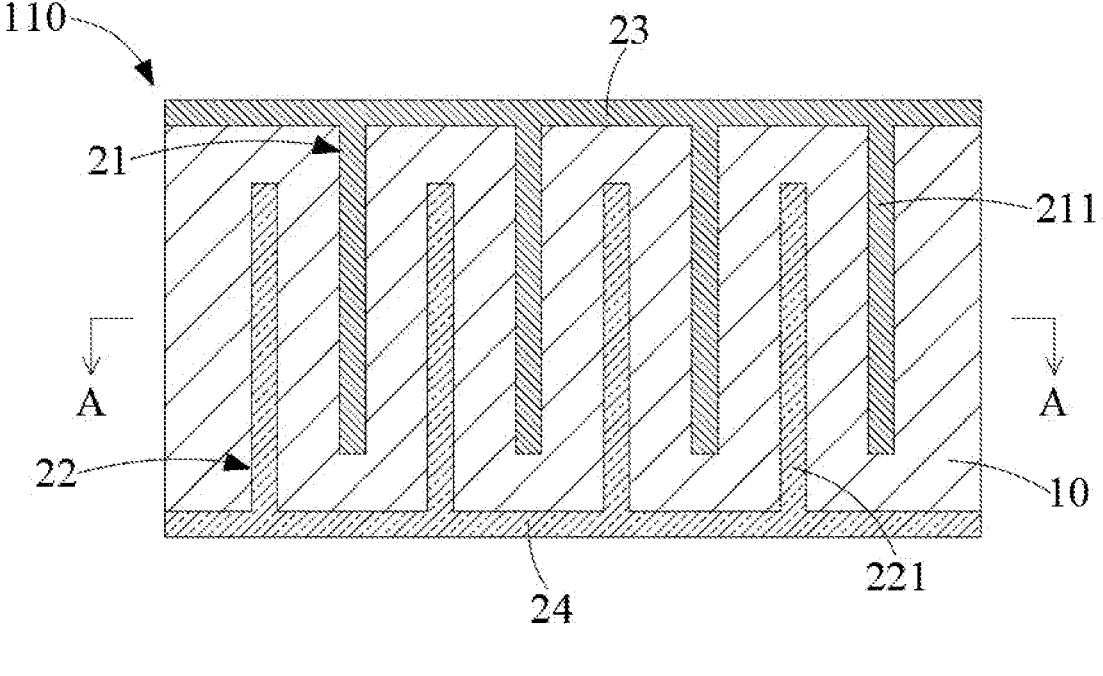
FIG. 2 is a schematic top view of an electrode substrate according to one or more embodiments of the present application.
Figure 3:
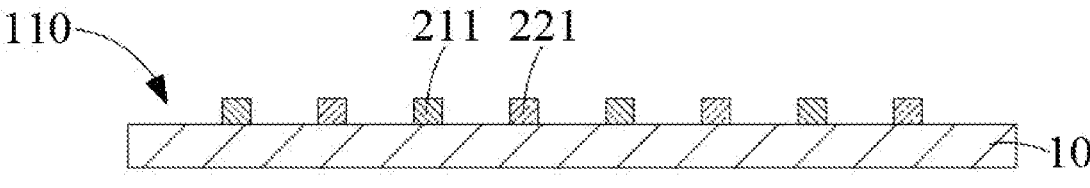
FIG. 3 is a schematic cross-sectional view of the electrode substrate taken along line A-A in FIG. 2.

At step 100, referring to FIGS. 2 and 3, there is provided an electrode substrate 110 including a substrate 10 and an electrode layer disposed on the substrate 10, the electrode layer includes a first electrode 21 and a second electrode 22 disposed at an interval.

Referring to FIG. 2, the first electrode 21 includes a plurality of first electrode units 211 disposed sequentially in a first direction and parallel to each other, and the second electrode 22 includes a plurality of second electrode units 221 disposed sequentially in the first direction and parallel to each other. The first electrode units 211 and the second electrode units 221 are alternately disposed in the first direction at intervals.

Referring to FIG. 2, the electrode layer may further include a first lead 23 connected to the first electrode 21 (i.e., the first lead 23 is connected to the plurality of first electrode units 211, respectively) and a second lead 24 connected to the second electrode 22 (i.e., the second lead 24 is connected to the plurality of second electrode units 221, respectively). When a voltage needs to be applied between the first electrode 21 and the second electrode 22, a power supply may be provided between the first lead 23 and the second lead 24, and the first lead 23 is provided to be connected to one of a positive terminal and a negative terminal of the power supply, and the second lead 24 is provided to be connected to the other of the positive terminal and the negative terminal of the power supply, thereby achieving a purpose of applying a voltage between the first electrode 21 and the second electrode 22.

Figure 4:
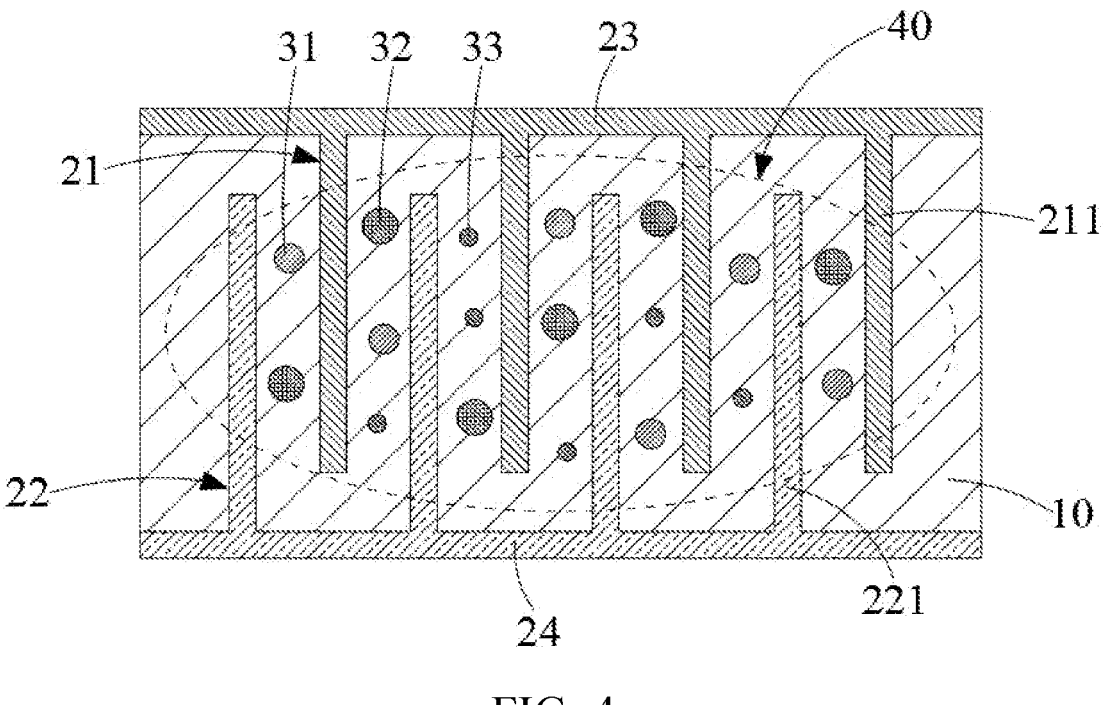
FIG. 4 is a schematic diagram of an electrode substrate according to one or more embodiments of the present application after quantum dots solution is applied on it.

At step 200, referring to FIG. 4, quantum dots solution 30 is applied on the electrode substrate 110. The quantum dots solution 30 includes quantum dots 31, nanoparticles 32, photoinitiators 33, and a solvent. An outer surface of each of the quantum dots 31 is modified with a first ligand 41, an outer surface of each of the nanoparticles 32 is modified with a second ligand 42. One of the first ligand 41 and the second ligand 42 is a compound containing a sulfhydryl group, the other is a compound containing a double bond. And one or more electrical properties of the quantum dots 31, the nanoparticles 32, and the photoinitiators 33 in the solvent are identical.

Exemplarily, "the one or more electrical properties of the quantum dots 31, the nanoparticles 32, and the photoinitiators 33 in the solvent are identical" means that the quantum dots 31, the nanoparticles 32, and the photoinitiators 33 are all positively charged in the solvent, or that the quantum dots 31, the nanoparticles 32, and the photoinitiators 33 are all negatively charged in the solvent.

It will be appreciated that in one or more embodiments, the first ligand 41 modifying on the outer surface of each of the quantum dots 31 is a compound containing a sulfhydryl group and the second ligand 42 modifying on the outer surface of each of the nanoparticles 32 is a compound containing a double bond. In other embodiments, the first ligand 41 modifying on the outer surface of each of the quantum dots 31 is a compound containing a double bond, and the second ligand 42 modifying on the outer surface of each of the nanoparticles 32 is a compound containing a sulfhydryl group.

Exemplarily, the compound containing a double bond may include at least one of oleic acid, acrylic acid, oleylamine and Y-methacryloxypropyltrimethoxysilane (KH-570). In one or more embodiments, the compound containing the double bond can be γ-methacryloxypropyltrimethoxysilane.

Exemplarily, the compound containing a sulfhydryl group may include at least one of dimercapto-terminated polyethylene glycol (SH-PEG-SH), 3-mercapto-β,4-dimethylcyclohexylethylthiol, 1,7-dodecyldithiol, 1,7-octyldithiol, 1,3-propanedithiol, (R)-6,8-dimercaptooctanoic acid, and 2,3-dithio (2-mercapto)-1-propanethiol.

Exemplarily, the photoinitiators 33 may include at least one of benzoin and its derivatives, a benzil compound, an alkylbenzophenone compound, an acyl phosphorus oxide, a benzophenone compound, and a thioxanthone-based compound. In one or more embodiments, the photoinitiators 33 may be 2-hydroxy-2-methyl-1-phenyl-1-propanone (UV1173).

Exemplarily, a particle size of each of the quantum dots 31 may be 10 nm~20 nm, e.g., 10 nm, 12 nm, 14 nm, 16 nm, 18 nm, 20 nm, etc.

Exemplarily, a particle size of the nanoparticles 32 is 10 nm~300 nm, for example, 10 nm, 30 nm, 50 nm, 80 nm, 100 nm, 150 nm, 200 nm, 250 nm, 300 nm, or the like.

Exemplarily, in the quantum dots solution 30, a mass ratio of the quantum dots 31 to the nanoparticles 32 may be (1~10):(10~1), such as 1:10, 1:8, 1:6, 1:4, 1:2, 1:1, 10:1, 8:1, 6:1, 4:1, 2:1, and the like.

Exemplarily, in the quantum dots solution 30, an amount of the photoinitiators 33 added is 0.1%~5%, such as 0.1%, 0.5%, 1%, 1.5%, 2%, 2.5%, 3%, 3.5%, 4%, 4.5%, 5%, or the like, of a total mass of the quantum dots 31 and the nanoparticles 32.

Exemplarily, a percentage of a sum of the quantum dots 31 and the nanoparticles 32 in the quantum dots solution 30 may be 10 wt %~60 wt %, e.g., 10 wt %, 20 wt %, 30 wt %, 40 wt %, 50 wt %, 60 wt %, or the like.

Exemplarily, each of the quantum dots 31 includes at least one of a core-shell structure quantum dot and a perovskite quantum dot, the core-shell structure quantum dot includes a light-emitting core including at least one of $ZnCdSe_2$, InP, $Cd_2SSe$, CdSe, $Cd_2SeTe$ and InAs, and an inorganic protective shell covering an outer surface of the light-emitting core, the inorganic protective shell includes at least one of CdS, ZnSe, $ZnCdS_2$, ZnS, ZnO.

Exemplarily, the nanoparticles 32 may include at least one of inorganic nanoparticles, organic nanoparticles, noble metal nanoparticles, colloidal nanosheets, colloidal nanorods. Exemplarily, the material of the nanoparticles 32 may include at least one of $SiO_2$, $BaSO_4$, $CaCO_3$, ZnSe, CdS, $TiO_2$, $BaTiO_3$, ZnS, $ZrO_2$, $Si_3N_4$, SnO, and ZnO.

It should be noted that the nanoparticles 32 function in that a plurality of quantum dots 31 may be spaced apart so as to avoid a problem that adjacent quantum dots 31 absorb light emitted from each other, thereby causing a decrease in a light output efficiency. Exemplarily, the nanoparticles 32 in the quantum dots solution 30 may include a plurality of nanoparticles 32 of different materials to perform different functions.

Exemplarily, the solvent may be a colorless, transparent, low boiling, volatile organic or inorganic solvent (water or aqueous solution), for example, the solvent may include at least one of propylene glycol methyl ether acetate (PG-MEA), ethanol, N,N-dimethylformamide (DMF), dimethyl sulfoxide (DMSO), ethyl acetate, and water. In one or more embodiments, the solvent may be propylene glycol methyl ether acetate (PGMEA).

Exemplarily, the photoinitiators 33 may include at least one of benzoin and its derivatives, a benzil compound, an alkylbenzophenone compound, an acyl phosphorus oxide, a benzophenone compound, and a thioxanthone compound. In one or more embodiments, the photoinitiators 33 may be 2-hydroxy-2-methyl-1-phenyl-1-propanone (UV1173).

In one or more embodiments, in the quantum dots solution 30, the first ligand 41 modifying on the surface of each of the quantum dots 31 is KH-570 (a compound containing a double bond), the second ligand 42 modifying on the surface of the nanoparticles 32 is SH-PEG-SH (a compound containing a sulfhydryl group). The photoinitiators 33 is UV1173, and the solvent is PGMEA. Since KH-570, SH-PEG-SH, and UV1173 are all negatively charged in PGMEA, when the first electrode 21 is positively charged and the second electrode 22 is negatively charged, the quantum dots 31, the nanoparticles 32, and the photoinitiators 33 in the quantum dots solution 30 all move toward the first electrode 21 with positive charges, and are finally deposited on the first electrode 21.

Exemplarily, the method of making the one or more electrical properties of the quantum dots 31, the nanoparticles 32, and the photoinitiators 33 in the solvent identical may be selecting a suitable first ligand 41, second ligand 42, and photoinitiators 33, or modifying with more ligands such as a fourth ligand and/or a fifth ligand on the outer surface of each of the quantum dots 31 and/or nanoparticles 32 such that the quantum dots 31, the nanoparticles 32, and the photoinitiators 33 are all positively or negatively charged in the solvent. For example, when the first ligand 41 modifying on the surface of each of the quantum dots 31 is a compound containing a double bond and having end group of an amino group, and the second ligand 42 modifying on the surface of each of the nanoparticles 32 is a compound containing a sulfhydryl group and having no amino group, then, a compound containing an amino group may further modify on the surfaces of the nanoparticles 32 so that the surface of each of the quantum dots 31 and each of the nanoparticles 32 both carry an amino group, thereby allowing the quantum dots 31 and the nanoparticles 32 to both carry a positive charge in the solvent.

Figure 5:
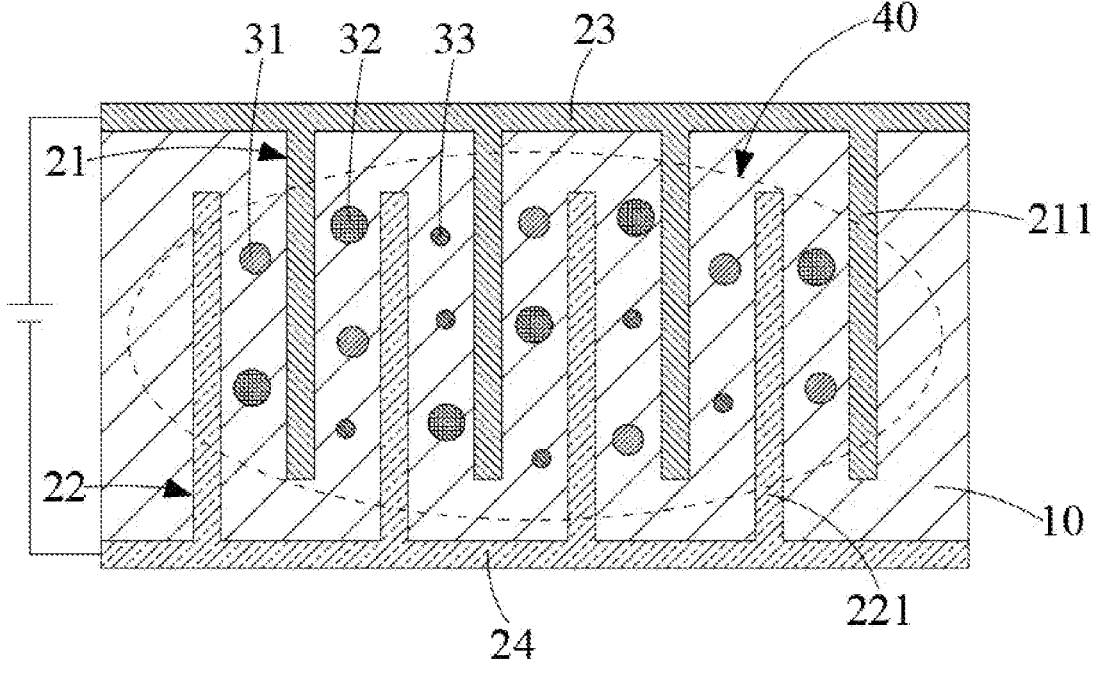
FIG. 5 is a schematic diagram of applying a voltage between a first electrode and a second electrode according to one or more embodiments of the present application.
Figure 6:
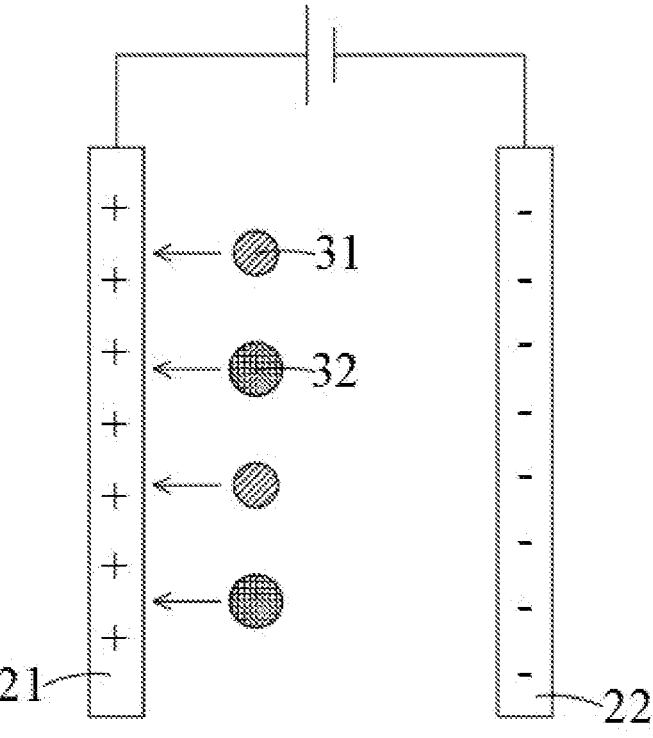
FIG. 6 is a schematic diagram of quantum dots and nanoparticles moving together toward a first electrode according to one or more embodiments of the present application.
Figure 7:
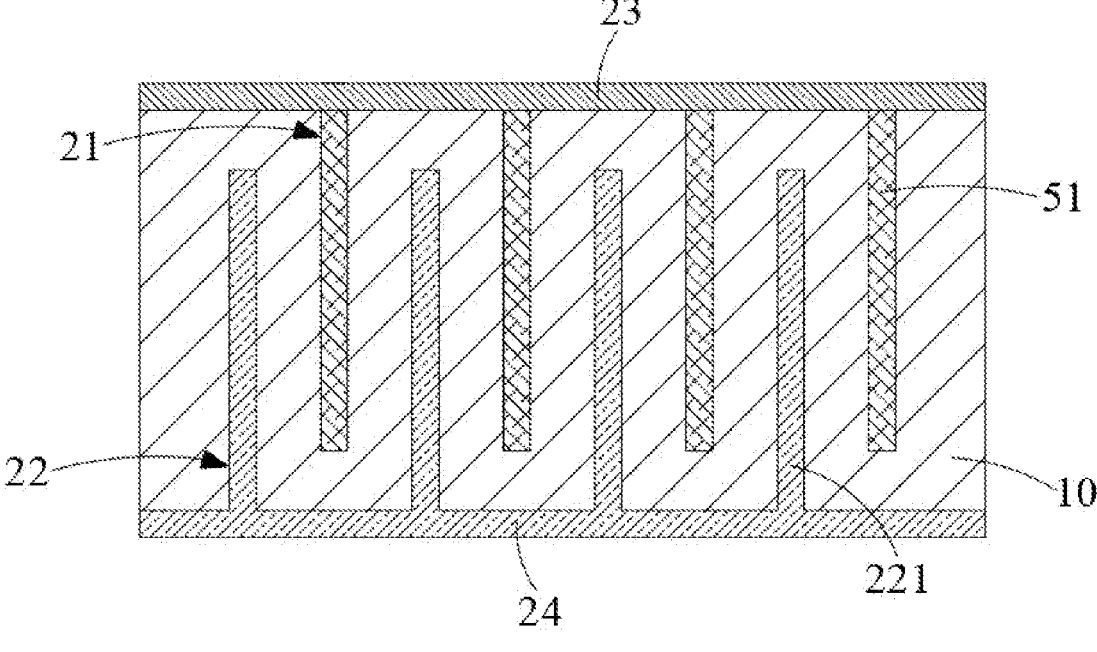
FIG. 7 is a schematic diagram of an electrodeposited film according to one or more embodiments of the present application after its formation.
Figure 8:
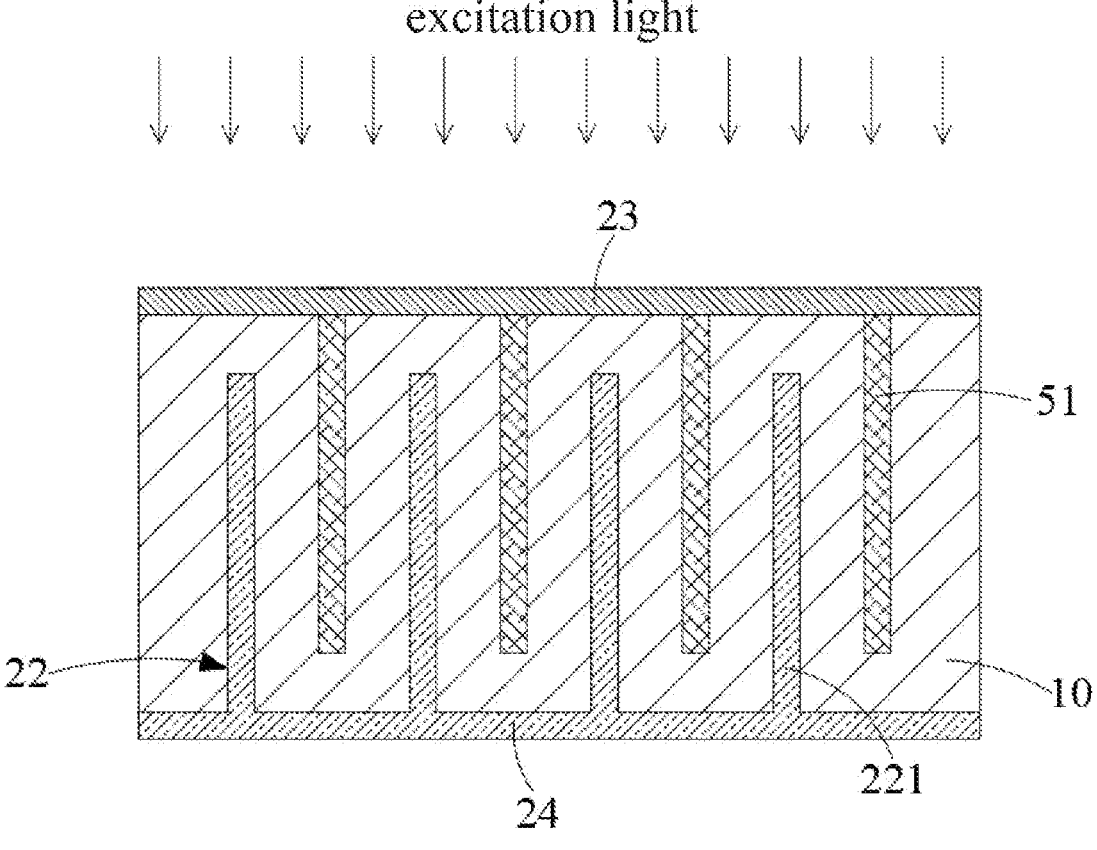
FIG. 8 is a schematic diagram of irradiating an electrodeposited film using excitation light according to one or more embodiments of the present application.

At step 300, referring to FIGS. 5 to 7, a voltage is applied between the first electrode 21 and the second electrode 22, and the quantum dots 31, the nanoparticles 32, and the photoinitiators 33 are co-deposited on the first electrode 21 or on the second electrode 22 to form an electrodeposited thin film 51.

It will be appreciated that when a voltage difference is formed between the first electrode 21 and the second electrode 22, an electric field between the first electrode 21 and the second electrode 22 may drive the quantum dots 31, the nanoparticles 32, and the photoinitiators 33 to move together toward the first electrode 21 or toward the second electrode 22, and finally be deposited on the first electrode 21 or on the second electrode 22. Referring to FIGS. 6 and 7, when the first electrode 21 is positively charged, the second electrode 22 is negatively charged, and the quantum dots 31, the nanoparticles 32, and the photoinitiators 33 all carry negative charges, the quantum dots 31, the nanoparticles 32, and the photoinitiators 33 move together toward the first electrode 21, and are finally deposited on the first electrode 21.

Referring to FIGS. 5-6, "applying a voltage between the first electrode 21 and the second electrode 22" may include providing a power supply between the first electrode 21 and the second electrode 22 such that a positive terminal of the power supply is connected to the first electrode 21 and a negative terminal of the power supply is connected to the second electrode 22.

Exemplarily, when a voltage is applied between the first electrode 21 and the second electrode 22, the electric field strength between any two adjacent first electrode unit 211 and second electrode unit 221 may be 0.1V/μm~10V/μm, for example, 0.1V/μm, 0.5V/μm, 1V/μm, 2V/μm, 3V/μm, 4V/μm, 5V/μm, 6V/μm, 7V/μm, 8V/μm, 9V/μm, 10V/μm, and the like.

At step 400, referring to FIGS. 8 to 11, the electrodeposited thin film 51 is irradiated by excitation light. Under the initiation of the photoinitiators 33, the first ligands 41 on the outer surfaces of the quantum dots 31 and the second ligands 42 on the outer surfaces of the nanoparticles 32 are subjected to a thiolene click reaction for crosslinking so that the quantum dots 31 and the nanoparticles 32 are connected to form a patterned quantum dots thin film 52 consistent with the pattern of the first electrode 21 or of the second electrode 22.

Figure 9:
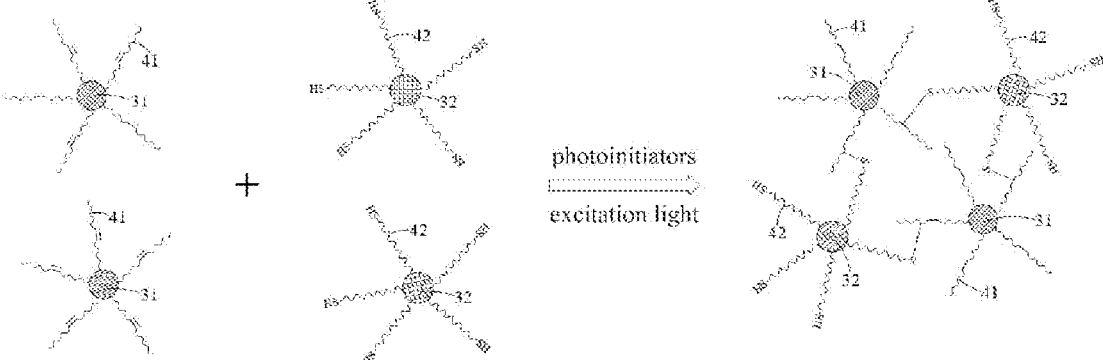
FIG. 9 is a schematic diagram of a thiol-ene click reaction of a first ligand on an outer surface of a quantum dot and a second ligand on an outer surface of a nanoparticle according to one or more embodiments of the present application.

Referring to FIG. 9, since one of the first ligand 41 and the second ligand 42 is a compound containing a sulfhydryl group and the other is a compound containing a double bond, when the photoinitiators 33 is excited, the first ligand 41 and the second ligand 42 are caused to undergo a thiolene click reaction, so that the first ligand 41 and the second ligand 42 are crosslinked together. It can be understood that when the first ligand 41 and the second ligand 42 are crosslinked together, the quantum dots 31 and the nanoparticles 32 are also connected together, and since any adjacent quantum dots 31 and the nanoparticles 32 can be connected together through a chemical bond, a crosslinked network structure can be formed in the patterned quantum dots thin film 52, thereby improving the density of the patterned quantum dots thin film 52, thereby avoiding the patterned quantum dots thin film 52 from being dissolved by a solvent, and improving the stability of the patterned quantum dots thin film 52.

Exemplarily, when the photoinitiators 33 in the quantum dots solution 30 is photoinitiators 33 that can be initiated by ultraviolet light, "the electrodeposited thin film 51 is irradiated by excitation light" may specifically include irradiating the electrodeposited film 51 with ultraviolet light (UV) for 10 minutes to 60 minutes, for example, 10 minutes, 20 minutes, 30 minutes, 40 minutes, 50 minutes, 60 minutes, and the like. Exemplarily, the wavelength of the ultraviolet light may be 10 nm~400 nm. In one or more embodiments, the wavelength of the ultraviolet light may be 365 nm.

Exemplarily, after step 400, the preparation method of the quantum dots substrate of the present embodiment may further include volatilizing the solvent in the quantum dots solution 30 to form a dried patterned quantum dots thin film 52.

Exemplarily, the solvent in the quantum dots solution 30 may be volatilized by heating, and in addition to achieving the effect of solvent volatilization during heating, the first ligands 41 on the surfaces of the quantum dots 31 and the second ligands 42 on the surfaces of the nanoparticles 32 may be further crosslinked, thereby further enhancing the density of the patterned quantum dots thin film 52.

According to the preparation method of the quantum dots substrate provided in the embodiment of the present invention, the first ligands 41 modify on the outer surfaces of the quantum dots 31, the second ligands 42 modify on the outer surface of the nanoparticles 32, and one of the first ligand 41 and the second ligand 42 is provided as a compound containing a sulfhydryl group, and the other is a compound containing a double bond, so that after the quantum dots 31 and the nanoparticles 32 are co-deposited on the first electrode 21 or on the second electrode 22, the first ligand 41 and the second ligand 42 can be crosslinked together by a thiolene click reaction under the initiation of the photoinitiators 33, so that the quantum dots 31 and the nanoparticles 32 are connected. The resulted pattern of the patterned quantum dots thin film 52 is consistent with the pattern of the first electrode 21 or of the second electrode 22, and the patterned quantum dots thin film 52 has a high density and is difficult to be dissolved by the solvent, thereby improving the stability of the patterned quantum dots thin film 52, which facilitates subsequent electrodeposition on the patterned quantum dots thin film 52 to form quantum dots thin film of other color, thereby obtaining a patterned multi-color quantum dots thin film. In addition, the method is simple in preparation process and suitable for large-scale production, and can be applied to quantum dots display fields such as QD CF (quantum dots color filter), QD LGP (quantum dots light guide plate), QLED (quantum dots light emitting diode), and QD-OLED (quantum dots OLED), and can also be applied to other fields related to nanoparticle patterning processes, such as solar cells and spectrometers.

Figure 10:
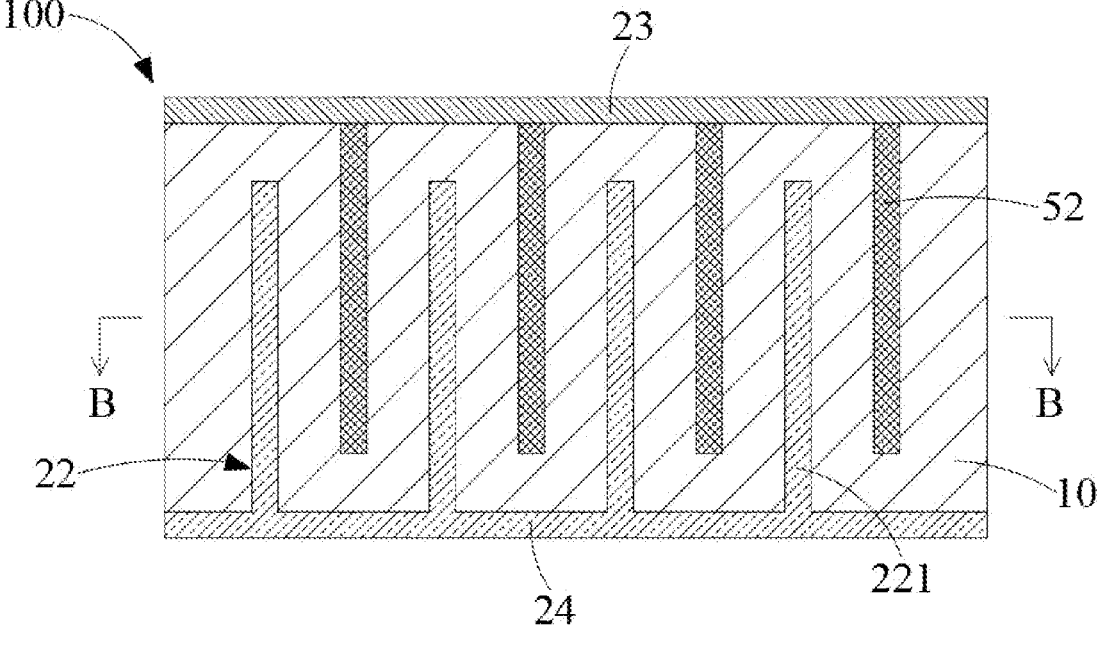
FIG. 10 is a schematic top view of a quantum dots substrate according to one or more embodiments of the present application.
Figure 11:
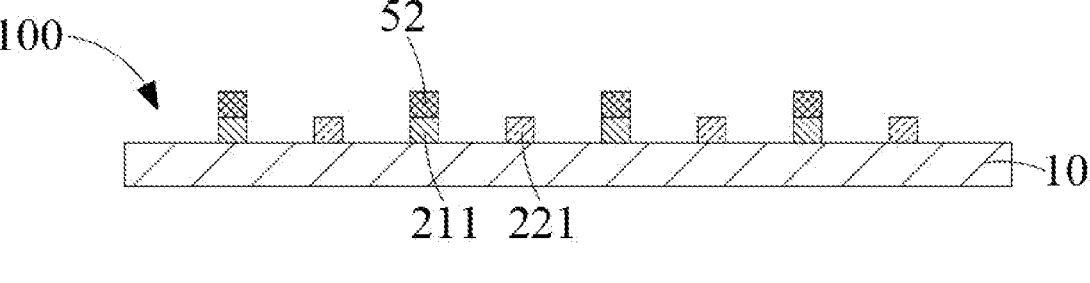
FIG. 11 is a schematic cross-sectional view of the quantum dots substrate taken along line B-B in FIG. 10.

Referring to FIG. 10 and FIG. 11, one or more embodiments of the present invention further provides a quantum dots substrate 100, which may be manufactured by the preparation method of the quantum dots substrate according to any one of the above embodiments. The quantum dots substrate 100 includes a substrate 10, an electrode layer, and a patterned quantum dots thin film 52, which are stacked in sequence.

Referring to FIG. 10 and FIG. 11, the electrode layer includes a first electrode 21 and a second electrode 22 disposed at an interval, and a pattern of the patterned quantum dots thin film 52 is consistent with a pattern of the first electrode 21 or of the second electrode 22.

The patterned quantum dots thin film 52 includes quantum dots 31 and nanoparticles 32, the outer surface of each of the quantum dots 31 is modified with a first ligand 41, the outer surface of each of the nanoparticles 32 is modified with a second ligand 42, one of the first ligand 41 and the second ligand 42 is a compound containing a sulfhydryl group, the other is a compound containing a double bond, and the first ligand 41 and the second ligand 42 are crosslinked by a thiolene click reaction.

The preparation method of the quantum dots substrate provided in the embodiment of the present invention and the quantum dots substrate are described in detail. The principles and embodiments of the present application have been elucidated with reference to specific examples, and the description of the above embodiments is provided to assist in understanding the present application. At the same time, variations will occur to those skilled in the art in both the detailed description and the scope of application in accordance with the teachings of the present application. In view of the foregoing, the present description should not be construed as limiting the application.

What is claimed is:

1. A preparation method of a quantum dots substrate, comprising:

providing an electrode substrate comprising a substrate and an electrode layer disposed on the substrate, the electrode layer comprising a first electrode and a second electrode disposed at an interval;

applying quantum dots solution on the electrode substrate, the quantum dots solution comprising quantum dots, nanoparticles, photoinitiators, and solvent, an outer surface of each of the quantum dots being modified with a first ligand, an outer surface of each of the nanoparticles being modified with a second ligand, one of the first ligand and the second ligand being a compound containing a sulfhydryl group and the other being a compound containing a double bond, one or more electrical properties of the quantum dots, the nanoparticles, and the photoinitiators being identical;

applying a voltage between the first electrode and the second electrode, such that the quantum dots, the nanoparticles, and the photoinitiators are co-deposited on the first electrode or on the second electrode to form an electrodeposited thin film;

irradiating the electrodeposited thin film with excitation light, wherein under an initiation of the photoinitiators, the first ligand on the outer surface of each of the quantum dots and the second ligand on the outer surface of each of the nanoparticles are subjected to a thiolene click reaction to crosslink so that each of the quantum dots and each of the nanoparticles are connected to form a patterned quantum dots thin film whose pattern is consistent with a pattern of the first electrode or of the second electrode.

2. The preparation method of the quantum dots substrate of claim 1, wherein the method further comprises volatilizing the solvent in the quantum dots solution to form the dried patterned quantum dots thin film.

3. The preparation method of the quantum dots substrate claim 1, wherein the compound containing the double bond comprises at least one of oleic acid, acrylic acid, oleylamine, and γ-methacryloxypropyltrimethoxysilane;

the compound containing the sulfhydryl group comprises at least one of dimercapto-terminated polyethylene glycol, 3-mercapto-β,4-dimethylcyclohexylethylthiol, 1,7-dodecyldithiol, 1,7-octyldithiol, 1,3-propanedithiol, (R)-6,8-dimercaptooctanoic acid, and 2,3-dithio (2-mercapto)-1-propanethiol; and the photoinitiators comprises at least one of benzoin and a derivative thereof, a benzil compound, an alkylbenzophenone compound, an acyl phosphorus oxide, a benzophenone compound, and a thioxanthone compound.

4. The preparation method of the quantum dots substrate according to claim 1, wherein each of the quantum dots has a particle size of 10 nm~20 nm and each of the nanoparticles has a particle size of 10 nm~300 nm.

5. The preparation method of the quantum dots substrate according to claim 1, wherein in the quantum dots solution, a mass ratio of the quantum dots to the nanoparticles is (1~10):(10~1), and an amount of the photoinitiators added is 0.1%~5% of a total mass of the quantum dots and the nanoparticles.

6. The preparation method of the quantum dots substrate according to claim 1, wherein the first electrode comprises a plurality of first electrode units sequentially arranged in a first direction and parallel to each other, and the second electrode comprises a plurality of second electrode units sequentially arranged in the first direction and parallel to each other, and the first electrode units and the second electrode units are alternately arranged in the first direction at intervals.

7. The preparation method of the quantum dots substrate according to claim 6, wherein when the voltage is applied between the first electrode and the second electrode, an electric field strength between adjacent first and second electrode units is $0.1V/\mu m \sim 10V/\mu m$.

8. The preparation method of the quantum dots substrate according to claim 1, wherein irradiating the electrodeposited thin film with excitation light comprises irradiating the electrodeposited thin film with ultraviolet light for 10 minutes to 60 minutes.

9. The preparation method of the quantum dots substrate according to claim 1, wherein each of the quantum dots comprise at least one of a core-shell structure quantum dot and a perovskite quantum dot, the core-shell structure quantum dot comprises a light-emitting core comprising at least one of $ZnCdSe_2$, InP, $Cd_2SSe$, CdSe, $Cd_2SeTe$ and InAs and an inorganic protective shell covering an outer surface of the light-emitting core, the inorganic protective shell comprises at least one of CdS, ZnSe, $ZnCdS_2$, ZnS, ZnO;

materials of the nanoparticles comprise at least one of $SiO_2$, $BaSO_4$, $CaCO_3$, ZnSe, CdS, $TiO_2$, $BaTiO_3$, ZnS, $ZrO_2$, $Si_3N_4$, SnO, and ZnO; and the solvent comprises at least one of propylene glycol methyl ether acetate, ethanol, N,N-dimethylformamide, dimethyl sulfoxide, ethyl acetate, and water.

10. The preparation method of the quantum dots substrate according to claim 2, wherein each of the quantum dots comprise at least one of a core-shell structure quantum dot and a perovskite quantum dot, the core-shell structure quantum dot comprises a light-emitting core comprising at least one of $ZnCdSe_2$, InP, $Cd_2SSe$, CdSe, $Cd_2SeTe$ and InAs and an inorganic protective shell covering an outer surface of the light-emitting core, the inorganic protective shell comprises at least one of CdS, ZnSe, $ZnCdS_2$, ZnS, ZnO;

materials of the nanoparticles comprise at least one of $SiO_2$, $BaSO_4$, $CaCO_3$, ZnSe, CdS, $TiO_2$, $BaTiO_3$, ZnS, $ZrO_2$, $Si_3N_4$, SnO, and ZnO; and the solvent comprises at least one of propylene glycol methyl ether acetate, ethanol, N,N-dimethylformamide, dimethyl sulfoxide, ethyl acetate, and water.

11. The preparation method of the quantum dots substrate according to claim 3, wherein each of the quantum dots comprise at least one of a core-shell structure quantum dot and a perovskite quantum dot, the core-shell structure quantum dot comprises a light-emitting core comprising at least one of $ZnCdSe_2$, InP, $Cd_2SSe$, CdSe, $Cd_2SeTe$ and InAs and an inorganic protective shell covering an outer surface of the light-emitting core, the inorganic protective shell comprises at least one of CdS, ZnSe, $ZnCdS_2$, ZnS, ZnO;

materials of the nanoparticles comprise at least one of $SiO_2$, $BaSO_4$, $CaCO_3$, ZnSe, CdS, $TiO_2$, $BaTiO_3$, ZnS, $ZrO_2$, $Si_3N_4$, SnO, and ZnO; and the solvent comprises at least one of propylene glycol methyl ether acetate, ethanol, N,N-dimethylformamide, dimethyl sulfoxide, ethyl acetate, and water.

12. The preparation method of the quantum dots substrate according to claim 4, wherein each of the quantum dots comprise at least one of a core-shell structure quantum dot and a perovskite quantum dot, the core-shell structure quantum dot comprises a light-emitting core comprising at least one of $ZnCdSe_2$, InP, $Cd_2SSe$, CdSe, $Cd_2SeTe$ and InAs and an inorganic protective shell covering an outer surface of the light-emitting core, the inorganic protective shell comprises at least one of CdS, ZnSe, $ZnCdS_2$, ZnS, ZnO;

materials of the nanoparticles comprise at least one of $SiO_2$, $BaSO_4$, $CaCO_3$, ZnSe, CdS, $TiO_2$, $BaTiO_3$, ZnS, $ZrO_2$, $Si_3N_4$, SnO, and ZnO; and the solvent comprises at least one of propylene glycol methyl ether acetate, ethanol, N,N-dimethylformamide, dimethyl sulfoxide, ethyl acetate, and water.

13. The preparation method of the quantum dots substrate according to claim 5, wherein each of the quantum dots comprise at least one of a core-shell structure quantum dot and a perovskite quantum dot, the core-shell structure quantum dot comprises a light-emitting core comprising at least one of $ZnCdSe_2$, InP, $Cd_2SSe$, CdSe, $Cd_2SeTe$ and InAs and an inorganic protective shell covering an outer surface of the light-emitting core, the inorganic protective shell comprises at least one of CdS, ZnSe, $ZnCdS_2$, ZnS, ZnO;

materials of the nanoparticles comprise at least one of $SiO_2$, $BaSO_4$, $CaCO_3$, ZnSe, CdS, $TiO_2$, $BaTiO_3$, ZnS, $ZrO_2$, $Si_3N_4$, SnO, and ZnO; and the solvent comprises at least one of propylene glycol methyl ether acetate, ethanol, N,N-dimethylformamide, dimethyl sulfoxide, ethyl acetate, and water.

14. The preparation method of the quantum dots substrate according to claim 6, wherein each of the quantum dots comprise at least one of a core-shell structure quantum dot and a perovskite quantum dot, the core-shell structure quantum dot comprises a light-emitting core comprising at least one of $ZnCdSe_2$, InP, $Cd_2SSe$, CdSe, $Cd_2SeTe$ and InAs and an inorganic protective shell covering an outer surface of the light-emitting core, the inorganic protective shell comprises at least one of CdS, ZnSe, $ZnCdS_2$, ZnS, ZnO;

materials of the nanoparticles comprise at least one of $SiO_2$, $BaSO_4$, $CaCO_3$, ZnSe, CdS, $TiO_2$, $BaTiO_3$, ZnS, $ZrO_2$, $Si_3N_4$, SnO, and ZnO; and the solvent comprises at least one of propylene glycol methyl ether acetate, ethanol, N,N-dimethylformamide, dimethyl sulfoxide, ethyl acetate, and water.

15. The preparation method of the quantum dots substrate according to claim 7, wherein each of the quantum dots comprise at least one of a core-shell structure quantum dot and a perovskite quantum dot, the core-shell structure quantum dot comprises a light-emitting core comprising at least one of $ZnCdSe_2$, InP, $Cd_2SSe$, CdSe, $Cd_2SeTe$ and InAs and an inorganic protective shell covering an outer surface of the light-emitting core, the inorganic protective shell comprises at least one of CdS, ZnSe, $ZnCdS_2$, ZnS, ZnO;

materials of the nanoparticles comprise at least one of $SiO_2$, $BaSO_4$, $CaCO_3$, ZnSe, CdS, $TiO_2$, $BaTiO_3$, ZnS, $ZrO_2$, $Si_3N_4$, SnO, and ZnO; and the solvent comprises at least one of propylene glycol methyl ether acetate, ethanol, N,N-dimethylformamide, dimethyl sulfoxide, ethyl acetate, and water.

16. The preparation method of the quantum dots substrate according to claim 8, wherein each of the quantum dots comprise at least one of a core-shell structure quantum dot and a perovskite quantum dot, the core-shell structure quantum dot comprises a light-emitting core comprising at least one of $ZnCdSe_2$, InP, $Cd_2SSe$, CdSe, $Cd_2SeTe$ and InAs and an inorganic protective shell covering an outer surface of the light-emitting core, the inorganic protective shell comprises at least one of CdS, ZnSe, $ZnCdS_2$, ZnS, ZnO;

materials of the nanoparticles comprise at least one of $SiO_2$, $BaSO_4$, $CaCO_3$, ZnSe, CdS, $TiO_2$, $BaTiO_3$, ZnS, $ZrO_2$, $Si_3N_4$, SnO, and ZnO; and the solvent comprises at least one of propylene glycol methyl ether acetate, ethanol, N,N-dimethylformamide, dimethyl sulfoxide, ethyl acetate, and water.

17. A quantum dots substrate comprising a substrate, an electrode layer, and a patterned quantum dots thin film stacked in sequence; wherein the electrode layer comprises a first electrode and a second electrode disposed at an interval, and a pattern of the patterned quantum dots thin film is consistent with a pattern of the first electrode or of the second electrode;

the patterned quantum dots thin film comprises quantum dots and nanoparticles, an outer surface of each of the quantum dots is modified with a first ligand, an outer surface of each of the nanoparticles is modified with a second ligand, one of the first ligand and the second ligand is a compound containing a sulfhydryl group and the other is a compound containing a double bond, and the first ligand and the second ligand are crosslinked by a thiolene click reaction.

\* \* \* \* \*